United States Patent [19]
Nixon

[11] Patent Number: 5,819,305
[45] Date of Patent: Oct. 6, 1998

[54] METHOD AND APPARATUS FOR CONFIGURING OPERATING MODES IN A MEMORY

[75] Inventor: Matthew R. Nixon, Austin, Tex.

[73] Assignee: Motorola, Inc., Schaumburg, Ill.

[21] Appl. No.: 703,175

[22] Filed: Aug. 23, 1996

[51] Int. Cl.[6] .............................. G06F 13/00; G11C 11/34
[52] U.S. Cl. ...................................... 711/100; 365/185.21
[58] Field of Search ..................................... 711/100, 163, 711/170, 173; 365/185.2, 185.21, 185.23, 190, 207, 228

[56] References Cited

U.S. PATENT DOCUMENTS

| | | | |
|---|---|---|---|
| 4,507,730 | 3/1985 | Johnson et al. | 711/170 |
| 4,975,882 | 12/1990 | Kuo et al. | 365/185.09 |
| 5,410,669 | 4/1995 | Biggs et al. | 711/118 |
| 5,528,535 | 6/1996 | Honjo et al. | 365/145 |
| 5,615,158 | 3/1997 | Ochoa et al. | 365/201 |
| 5,715,190 | 2/1998 | Honjo et al. | 365/149 |

*Primary Examiner*—Tod R. Swann
*Assistant Examiner*—Conley B. King, Jr.
*Attorney, Agent, or Firm*—Sandra L. Godsey; Susan C. Hill

[57] ABSTRACT

An integrated circuit (10) includes a memory (20) which has a plurality of memory modes, including a high density memory mode and a high speed/reliability memory mode. The high speed/reliability memory mode may alternately be used as a high reliability memory mode. Memory (20) includes a configuration circuit (80) which selects one of the plurality of memory modes. Configuration circuit (80) provides configuration information to sense amplifier control circuit (72). Sense amplifier control circuit (72) provides control information to sense amplifiers (70) in order to place sense amplifiers (70) in one of a plurality of operating modes. In one embodiment, the plurality of operating modes of sense amplifiers (70) includes a complementary differential operating mode and a referenced differential operating mode.

22 Claims, 3 Drawing Sheets

METHOD AND APPARATUS FOR CONFIGURING OPERATING MODES IN A MEMORY

REFERENCE TO RELATED APPLICATIONS

The present application is related to the following U.S. patent application:

"Data Processing System having a Memory with a Low Power Operating Mode and Method Therefor", invented by Robert W. Sparks, et al., Ser. No. 08-169,103, now U.S. Pat. No. 5,737,566, assigned to the assignee hereof, and which is herein incorporated by reference;

"Memory Suitable for Operation at Low Power Supply Voltages and Sense Amplifier Therefor", by Bruce Lee Morton, Ser. No. 08/703,176, now U.S. Pat. No. 5,729,493, filed concurrently herewith, and assigned to the assignee hereof;

"Control Gate Driver Circuit for a Non-Volatile Memory and Memory Using Same", by Bruce Lee Morton, Ser. No. 08/703,174, now U.S. Pat. No. 5,721,704, filed concurrently herewith, and assigned to the assignee hereof; and "Non-Linear Charge Pump", by Bruce Lee Morton et al., Ser. No. 08/703,103, now U.S. Pat. No. 5,740,109, filed concurrently herewith, and assigned to the assignee hereof.

FIELD OF THE INVENTION

This invention relates generally to memories, and more particularly, to a method for configuring operating modes in a memory circuit.

BACKGROUND OF THE INVENTION

Conventional memory is designed to meet a performance requirement or a density requirement. Typically, density is sacrificed to achieve higher performance, and performance is sacrificed to achieve higher density. And therefore one type of array cannot be used for different target applications. Many times high speed and high density memory cells are identical and only the sensing amplifier circuitry is different.

Often a memory array, such as a two-transistor (2T) flash memory array is designed with differential sense amplifiers located in the middle of two halves of the array. The switching speed of the sense amplifier is then determined by the speed at which the sense amplifier inputs diverge. A bit line from a column on one side of the array provides one input to the differential sense amplifier, while a reference current provides the other input. Address decode circuitry determines which side of the array is sensed. To maximize speed, the reference current should sink about half of the bit cell current. To maximize reliability, the reference current should be lowered to sense lower bit cell currents brought on by lifetime bit cell degradation, however lower reference currents extend sensing time.

As computing increases in complexity the need for greater flexibility in memory circuits is magnified. There is a need to reconcile alternate memory access methods within a single memory.

DETAILED DESCRIPTION OF THE FIGURES

Figure 1:
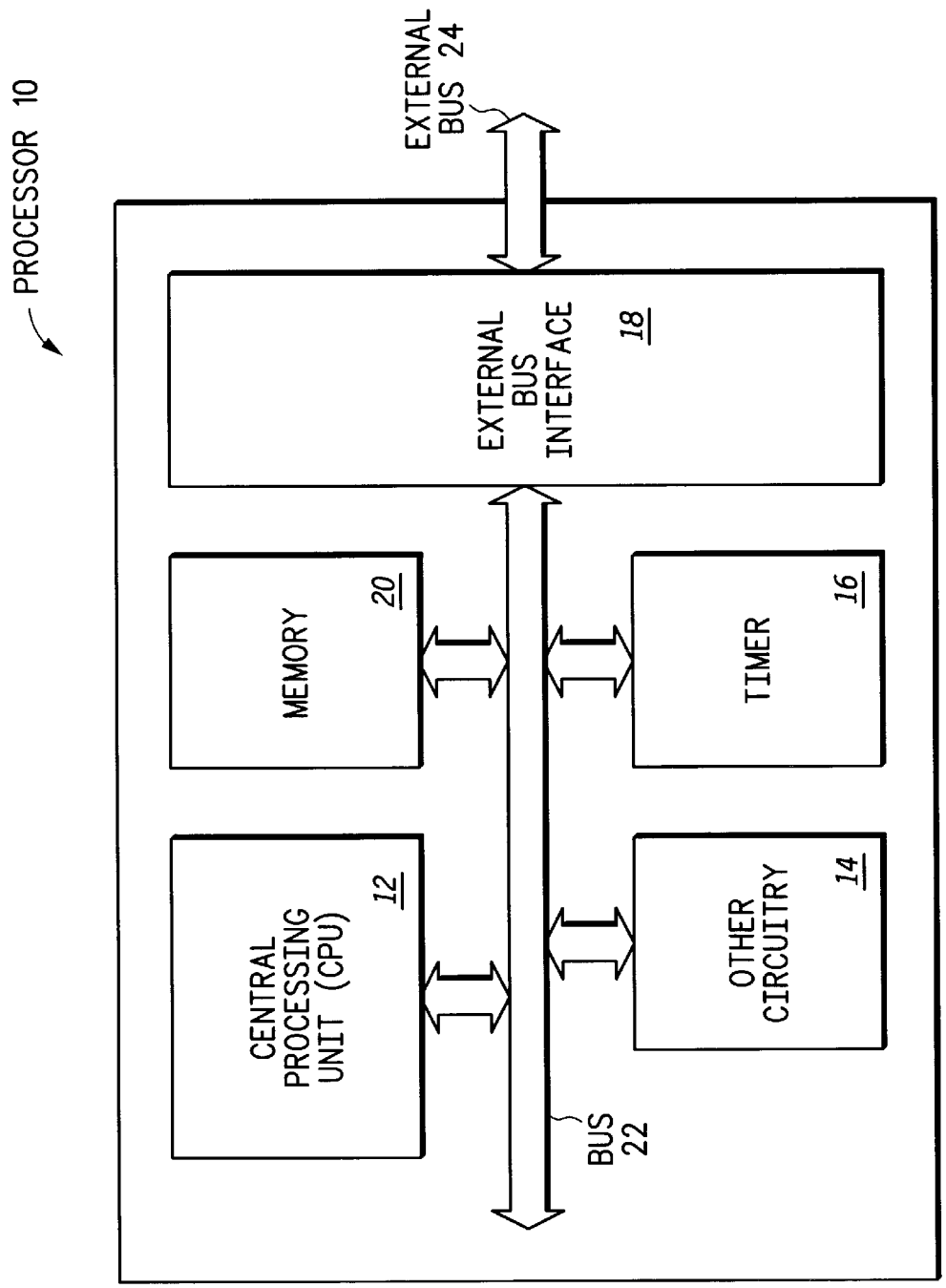
FIG. 1 illustrates, in block diagram form, a processor having a memory in accordance with the present invention.

FIG. 1 illustrates processor 10, according to one embodiment of the present invention, having central processing unit 12 (CPU), memory 20, external bus interface 18, timer 16 and other circuitry 14, each bi-directionally coupled to bus 22. External bus interface 18 is also bi-directionally coupled to external bus 24, which is available external to processor 10.

Figure 2:
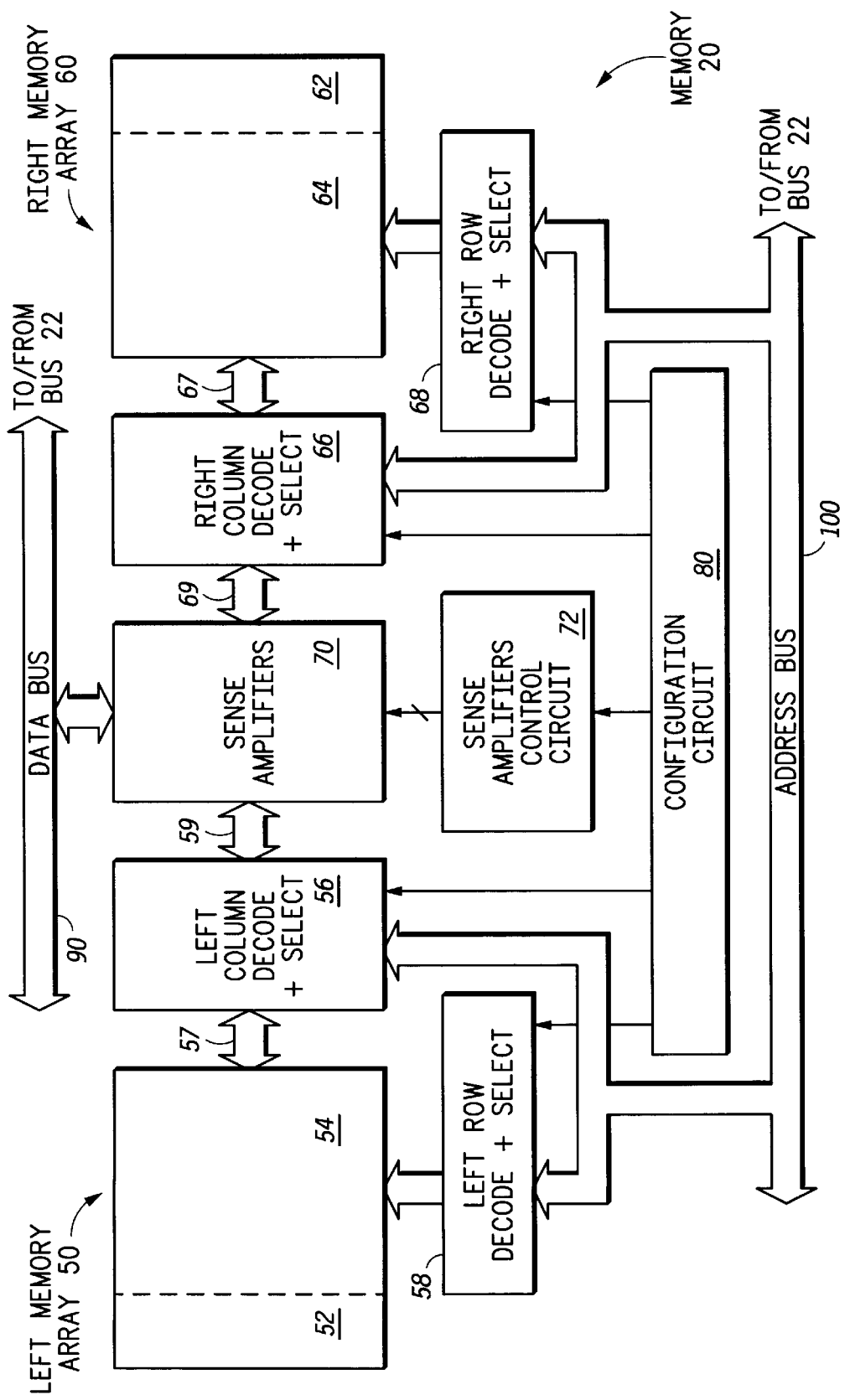
FIG. 2 illustrates, in block diagram form, a configurable memory in accordance with the present invention.

FIG. 2 illustrates memory 20, which includes left memory array 50, right memory array 60, configuration circuit 80, sense amplifiers control circuit 72, and sense amplifiers 70. Left memory array 50 and right memory array 60 each include a plurality of memory bit cells. In one embodiment of the present invention, left memory array 50 and right memory array 60 are each configurable as a first portion and a second portion. Left memory array 50 is configurable as portion 52 and portion 54. Right memory array 60 is configurable as portion 62 and portion 64.

Left memory array 50 is coupled to left row decode and select 58. Right memory array 60 is coupled to right row decode and select 68. Address bus 100 is coupled to left row decode and select 58, left column decode and select 56, right row decode and select 68, and right column decode and select 66.

Left column decode and select 56 is coupled to left memory array 50 by way of conductors 57. Right memory array 60 is coupled to right column decode and select 66 by way of conductor 67. Left column decode and select 56 is further coupled to sense amplifiers 70 by way of conductors 59. Right column decode and select 66 is coupled to sense amplifiers 70 by way of conductor 69. Sense amplifiers 70 is then bi-directionally coupled to data bus 90. Data bus 90 and address bus 100 are both coupled to bus 22.

Sense amplifiers control circuit 72 is coupled to sense amplifiers 70 and configuration circuit 80. Configuration circuit 80 is then coupled to left row decode and select 58, right row decode and select 68, left column decode and select 56, and right column decode and select code 66.

Note that although FIG. 2 illustrates memory 20 as having separated blocks for sense amplifiers control circuit 72, sense amplifiers 70, configuration circuit 80, as well as row and column decoders, FIG. 2 is a functional representation. Alternate embodiments may implement the present invention using combined functional blocks or may refer to these functional blocks in an alternate configuration. The illustration of FIG. 2 is organized so as to provide a functional description of the present invention.

Figures 3, 4:
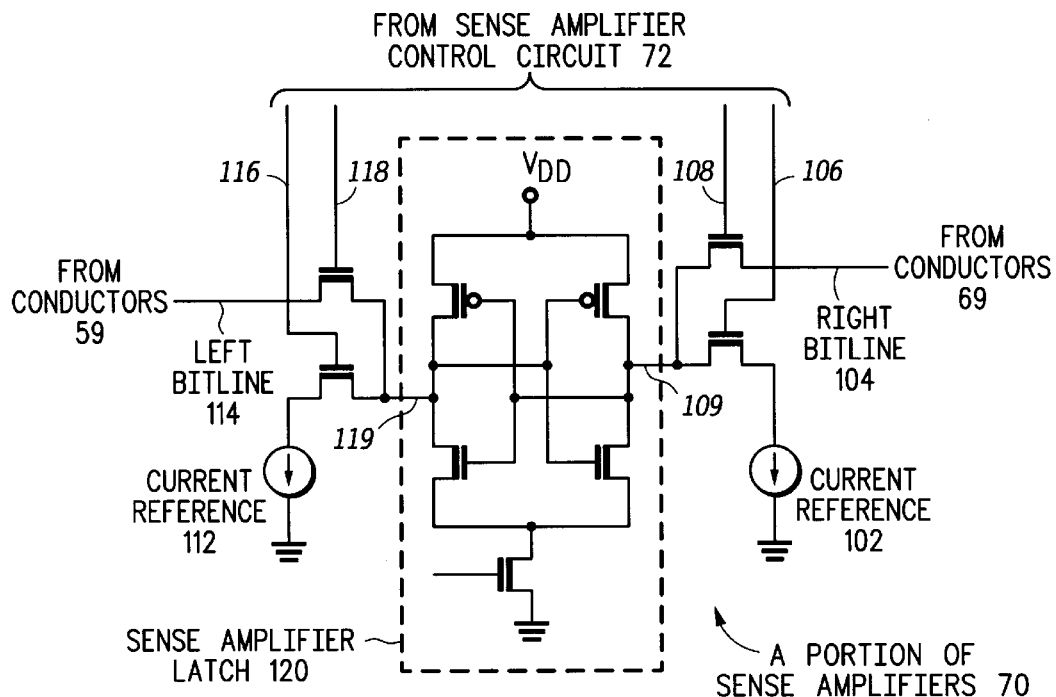
FIG. 3 illustrates, in circuit diagram form, a portion of a sense amplifier circuit in accordance with the present invention.
FIG. 4 illustrates, in block diagram form, a register for circuit configuration in accordance with the present invention.

FIG. 3 illustrates a portion of sense amplifiers 70 in further detail. According to one embodiment of the present invention, sense amplifier control circuit 72 receives control information by way of conductors 116, 118, 106 and 108. Right bit line 104 is coupled to conductors 69, and left bit line 114 is coupled to conductors 59. Conductors 59 and 69 allow left memory array 50, right memory array 60, left column decode and select 56, and right column decode and select 66 to communicate with sense amplifiers 70.

Conductor 116 effectively controls current reference 112 through a transistor, while conductor 118 effectively controls left bit line 114 through a transistor. Conductor 106 effectively controls current reference 102 through a transistor, while conductor 108 effectively controls left bit line 104 through a transistor. Conductors 116 and 118 serve to control the left side input to sense amp latch 120. Conductors 106 and 108 serve to control the right side input to the sense amp latch 120. Conductor 119 is the left input to sense amp latch 120 and conductor 109 is the right input to sense amp latch 120. In one embodiment of the present invention, control of current references 102 and 112, and left bitline 114 and right bitline 104 refers to enable/disable control.

In FIG. 3 sense amp latch 120 includes circuitry for enable/disable control and is coupled to supply voltage, VDD. In alternate embodiments of the present invention, sense amp latch 120 may include other control circuitry or functional blocks may be defined according to alternate configurations. FIG. 3 illustrates one embodiment of the present invention where a portion of the circuit is designated by the functional description of sense amp latch circuit 120. Alternate embodiments of the present invention may have other areas so designated, while maintaining the functional consistency with the present invention.

FIG. 4 illustrates configuration circuit 80 as a register, consistent with one embodiment of the present invention. Configuration circuit 80 includes a plurality of bits. Bit fields 82 and 84 are used for high density/high speed (HDHS) selection. In one embodiment of the present invention, bit field 82 is a single bit, where a first value of bit field 82 effects a high speed mode and a second value of bit field 82 effects a high density mode. Bit fields 83 and 85 correspond to address ranges. In one embodiment of the present invention, each HDHS has an associated address range which it effects. For example, in one embodiment of the present invention, HDHS selection of bit field 82 is associated with the address range of bit field 83, and HDHS selection of bit field 84 is associated with the address range of bit field 85. Bit fields 82, 83, 84, and 85 may include any number of bits. Further configuration circuit 80, as illustrated in FIG. 4 may include any number of bit fields. Each bit field can be any number of bits. Configuration circuit 80 may be mask programmable or may be write and/or read accessible by way of bus 22 from CPU 12 or external bus 24.

Operation of Preferred Embodiments

Many types of memory arrays are designed using differential sense amplifiers, commonly called "sense amps". Differential sense amplifiers operate by comparing two or more voltages. Comparison voltages are often developed by bit cells and or current sources. In one memory design, each memory bit has an associated memory cell. The bit line from a memory cell is provided to a sense amplifier. The sense amplifier then compares the bit line voltage to another bit line voltage or to a voltage developed by a reference current. Generally, speed is determined by rate at which the difference is developed between compared voltage. Often a single reference current, which is to be compared to both high and low bitline values, is selected as an average of bit line high and bit line low values, so as to maximize the comparison voltage difference for both high and low values.

Sense amplifiers may operate according to a high density scheme or a high speed scheme. The two schemes provide different advantages and the designer chooses between access speed and memory quantity. The present invention offers a method of configuring the memory array into portions, where one portion may be used for high density and one portion for high speed. The configuration is programmable, adding flexibility to design and use. The present invention is a configurable memory array capable of switching between a high speed configuration and a high density configuration. The same array is then available for many applications, saving design resources and offering flexibility to users. One embodiment of the present invention incorporates a high speed and high reliability mode. An alternate embodiment of the present invention incorporates a high reliability mode.

Referring to FIG. 2, sense amplifier control circuit 72 provides control signals to sense amplifiers 70 which control the configuration of memory 20, and the interaction of sense amplifiers 70 with left memory array 50 and right memory array 60. For example, in one embodiment of the present invention, a high density configuration is effected in a referenced differential operating mode, where the differential sense amplifiers compare bit line voltage to a voltage developed by a reference current. As seen in FIGS. 2 and 3, a read or write (i.e. access) to a bit having a bit cell in left memory array 50 involves sense amplifiers 70 comparing left bit-line 114 to current reference 102. Sense amplifier control circuit 72 controls the input to sense amp latch 120, in response to control signals received via conductor 118, by providing left bit-line 114 as the left input to sense amp latch 120. Further, in response to control signals received via conductor 106, sense amplifier control circuit 72 provides current reference 102 as the right input into sense amp latch 120.

To sense a bit in right memory array 60, sense amplifier control circuit 72 controls the right input to sense amp latch 120, via conductor 108, providing right bit line 104 as the right input to sense amp latch 120. Sense amplifier control circuit 72 uses conductor 116 to provide current reference 112 as the left input to sense amp latch 120.

Sense amplifier control unit 72 provides the control signals of conductors 116, 118, 106 and 108. The present invention allows sense amplifier control circuit 72 to determine a mode for operation of sense amplifiers 70. Sense amplifier control circuit 72 selectively configures memory 20 according to configuration circuit 80. In one embodiment of the present invention, sense amplifier control circuit 72 effects a complementary differential operating mode and a referenced differential operating mode. Sense amplifier control circuit 72 configures left memory array 50 and right memory array 60 into portions according to operating mode. One embodiment configures one portion as complementary differential operating mode and one portion as referenced differential operating mode.

For complementary differential operating mode, sense amplifier control circuit 72 provides control signals to sense amplifiers 70 which causes conductor 118 to provide left bit-line 114 as the left input to sense amplifier latch 120 and causes conductor 108 to provide right bit-line 104 as the right input to sense amp latch 120. Here left memory array 50 and right memory array 60 will be programmed in a complementary pattern. Complementary programming associates two bit cells with each bit of memory; one bit cell in left memory array 50 and one bit cell in right memory array 60. The bit cell in left memory array 50 will be the complement of the bit cell in right memory array 60. Complementary differential operating mode has twice the memory requirement of referenced differential operating mode (i.e. two memory cells are required to represent a bit of data.)

Sense amplifier control circuit 72 receives control information from configuration circuit 80. In one embodiment of the present invention, configuration circuit 80 is implemented as a register, as illustrated in FIG. 4. Configuration circuit 80 includes bit fields 82, 83, 84 and 85, and may contain any number of bit fields. Bit field 82 selects HDHS for address range associated with bit field 83. HDHS selection determines complementary differential operating mode or referenced differential operating mode. Note that alternate embodiments may implement any number of modes, and bit field 82 may have any number of bits to accommodate mode selection. The selection made in bit 82 effects the address range associated with bit field 83. Note that address range 83 and address range 85 are represented by a bit field which may include any number of bits. Alternate embodiments of configuration circuit 80 may implement a single HDHS bit which effects the entire array, or may implement configuration control through pin voltage(s), fuse(s), pin out option (s) or programmable mask option(s). Configuration circuit 80, as illustrated in FIG. 4, is coupled to data bus 90 and address bus 100 for control by CPU12. Note that configuration circuit 80 may be written and/or read by CPU12. In one embodiment, configuration circuit 80 is programmable during program execution, allowing software control. The present invention offers a flexible configuration method that is available in a hard wired configuration or a software configuration.

In one embodiment of the present invention, configuration circuit 80 includes bit field 82 for HDHS selection which is associated with an address range designated using bit field 83. In one embodiment, bit field designates the address range associated with portion 52 of left memory array 50 (see FIG. 2.) In one embodiment of the present invention, bit field 83 designates the address range of portion 52 and designates by implication the address range of portion 62, as individual designation is precluded by the availability of complementary differential operating mode. Complementary differential operating mode requires one bit cell in left memory array 50 and one bit cell in right memory array 60. Therefore, if portion 52 is programmed for complementary differential operating mode, portion 62 is required. Referenced differential operating mode does not require two bit cells. Note that in one embodiment having a complementary differential operating mode and a referenced differential operating mode, it is not possible to designate portion 62 as complementary without so designating portion 52. This precludes portion 52 and portion 62 from having dissimilar operating mode designations.

Referenced differential operating mode is selected in bit field 82 and effects portions 52 and 62. HDHS selection of complementary operating mode for portions 54 and 64, both associated with address range 85, is then done through bit field 84. Referring to FIG. 2, the effective configuration is for portions 52 and 62 as referenced differential operating mode and portions 54 and 64 as complementary operating mode. Each memory bit with a bit cell in portion 54 has a corresponding complementary bit cell in portion 64. Whereas a memory bit with a bit cell in portion 52 does not have a corresponding bit in portion 62.

The following description refers to one embodiment of the present invention illustrated in FIGS. 1 to 4. For a read access from or a write access to data in portion 52, sense amplifiers 70 operate according to a referenced differential operating mode. Referenced differential operating mode for portion 52 will compare the left bit-line 114 to current reference 102. Reference differential operating mode for portion 62 will compare right bitline 104 and current reference 112. These modes compare the bit line voltage with a voltage developed by a reference current, where reference current is typically a function of bit cell current.

A read from or a write to portion 54 and 64 uses a complementary differential operating mode. In complementary differential operating mode, left bit-line 114 is compared to right bit-line 104. Control of sense amplifiers 70 is effected through conductors 118 and 108 which provide left bit-line 114 as the left input to sense amp latch 120 and right bit-line 104 as the right input to sense amp latch 120. Portion 54 and portion 64 have complementary programming. According to one embodiment of the present invention, complementary programming defines bit values according to left bit cell and right bit cell combination pairs. A high bit value has a logical high left bit cell value and a logical low right bit cell value. Consistently, a low bit value has a logical low left bit cell value and a logical high right bit cell value. An alternate embodiment of the present invention utilizes the opposite combination pairs. Note that for complementary differential operating mode, the input voltages diverge more quickly than referenced differential operating mode, resulting in reduced sensing time and/or increased reliability. Access time in complementary differential operating mode is the same for a read of a logical low or a logical high. Alternative embodiments of the present invention implement complementary differential operating mode at a lower frequency to increase reliability over time. Sensing two bit lines per memory bit seeks to compensate for bit cell failures and degradation.

Alternate embodiments of the present invention allow configuration of left memory array 50 and right memory array 60 into any number of portions. Complementary differential operating mode requires that those portions selected for high speed have associated portions in left memory array 50 and right memory array 60, as seen in portions 54 and 64 of FIG. 2. One embodiment of the present invention allows HDHS selection of complementary differential operating mode to effect the entire array, where each memory bit has an associated bit cell in left memory array 50 and an associated bit cell in right memory array 60. Alternate embodiments include any number of operating modes which allow configuration of memory 20 into portions in accordance with the present invention.

One embodiment of the present invention considers bit cell degradation. Programmable non-volatile memories typically suffer from long term bit cell degradation problems. To resist degradation, an additional operating mode is available where each side of a memory array is programmed with identical data. Corresponding bit lines are tied together for comparison to a voltage developed by a reference current. Failure of one of the two corresponding bit cells fails over time has a less significant effect on the memory array.

The present invention allows flexibility in a variety of memory circuits. Complementary differential operating mode allows the user to determine and adjust the trade off between high density and high speed operation in a memory circuit. Additionally, high performance modes such as complementary differential operating mode allow the user to reduce power consumption for those portions of memory as reference currents are not used. The present invention is applicable to any memory circuit which implements a sensing amplifier using single ended sensing, for example read only memory (ROM), electrically programmable read only memory (EPROM), electrically erasable programmable read only memory (EEPROM), etc. Efficient use of a memory circuit allows for specific application configurations. The present invention offers a flexible, efficient method of configuring a memory circuit.

The flexible, efficient configuring of a memory circuit may be particularly useful when the memory is located on the same integrated circuit as a processing unit. However, the present invention is also very useful for stand alone memory integrated circuits and memories embedded with other types of circuitry.

What is claimed is:

1. An integrated circuit, comprising:

a memory array;

a plurality of sense amplifiers, coupled to said memory array, each one of said plurality of sense amplifiers having a complementary differential operating mode and a referenced differential operating mode;

a configuration circuit for selecting one of a plurality of memory modes, the plurality of memory modes including a high density memory mode and a high speed/reliability memory mode, said configuration circuit providing at least one configuration signal; and a sense amplifier control circuit, coupled to said configuration circuit for receiving the at least one configuration signal, and coupled to said plurality of sense amplifiers for providing at least one control signal to said plurality of sense amplifiers, the at least one control signal selecting whether said plurality of sense amplifiers is in the complementary differential operating mode or the referenced differential operating mode; and wherein said at least one control signal selects the complementary differential operating mode of each one of said plurality of sense amplifiers when said configuration circuit selects the high speed/reliability memory mode, and wherein said at least one control signal selects the referenced differential operating mode of each one of said plurality of sense amplifiers when said configuration circuit selects the high density memory mode.

2. An integrated circuit as in claim 1, wherein said configuration circuit is mask programmable.

3. An integrated circuit as in claim 1, wherein said configuration circuit comprises:

a first register bit field for selecting one of the high density memory mode and the high speed/reliability memory mode.

4. An integrated circuit as in claim 3, further comprising:

a bus, coupled to said configuration circuit, said bus providing a user programmable value to said first register bit field.

5. An integrated circuit as in claim 4, further comprising:

a processor, coupled to said bus, said processor providing the user programmable value to said first register bit field during a software write access.

6. An integrated circuit as in claim 3, wherein said configuration circuit further comprises:

a second register bit field for selecting a first address range.

7. An integrated circuit as in claim 6, further comprising:

decode circuitry, coupled to said memory array; and wherein said configuration circuit provides at least one address range signal to said decode circuitry, said at least one address range signal corresponding to said first address range.

8. An integrated circuit as in claim 6, wherein the first register bit field selects one of the high density memory mode and the high speed/reliability memory mode for the first address range.

9. An integrated circuit as in claim 8, wherein said configuration circuit further comprises:

a third register bit field for selecting a second address range; and a fourth register bit field for selecting one of the high density memory mode and the high speed/reliability memory mode for the second address range.

10. An integrated circuit as in claim 1, wherein said memory array comprises:

a first memory array portion having a first memory cell; and a second memory array portion having a second memory cell; and wherein a first one of said plurality of sense amplifiers detects a first differential current between the first memory cell and the second memory cell when the first one of said plurality of sense amplifiers is in the complementary differential operating mode, and wherein the first one of said plurality of sense amplifiers detects a second differential current between the first memory cell and a reference current when the first one of said plurality of sense amplifiers is in the referenced differential operating mode.

11. An integrated circuit as in claim 10, wherein the first one of said plurality of sense amplifiers detects a third differential current between the second memory cell and a second reference current when the first one of said plurality of sense amplifiers is in the referenced differential operating mode.

12. An integrated circuit, comprising:

a memory array;

a sense amplifier, coupled to said memory array, said sense amplifier having a first operating mode and a second operating mode;

a configuration circuit for selecting one of a plurality of memory modes, the plurality of memory modes including a first memory mode and a second memory mode, said configuration circuit providing at least one configuration indicator; and a sense amplifier control circuit, coupled to said configuration circuit for receiving the at least one configuration indicator, and coupled to said sense amplifier for providing at least one control signal to said sense amplifier, the at least one control signal placing said sense amplifier in the first operating mode if the at least one configuration indicator is a first value, and placing said sense amplifier in the second operating mode if at least one configuration indicator is a second value;

wherein the first value corresponds to the first memory mode and the second value corresponds to the second memory mode.

13. An integrated circuit as in claim 12, wherein said configuration circuit comprises:

a first register portion for selecting one of said first operating mode and said second operating mode.

14. An integrated circuit as in claim 13, further comprising:

a bus, coupled to said configuration circuit; and a processor, coupled to said bus, for providing a user programmable value to said first register portion via said bus during a software write access.

15. An integrated circuit as in claim 13, wherein said configuration circuit further comprises:

a second register portion for selecting a first address range.

16. An integrated circuit as in claim 15, further comprising:

decode circuitry, coupled to said memory array; and wherein said configuration circuit provides at least one address range signal to said decode circuitry, said at least one address range signal corresponding to said first address range.

17. An integrated circuit comprising:

a memory array:

a sense amplifier, coupled to said memory array, said sense amplifier having a first operating mode and a second operating mode;

a configuration circuit for selecting one of said first operating mode and said second operating mode, said configuration circuit providing at least one configuration indicator; and a sense amplifier control circuit, coupled to said configuration circuit for receiving the at least one configuration indicator, and coupled to said sense amplifier for providing at least one control signal to said sense amplifier, the at least one control signal placing said sense amplifier in the first operating mode if the at least one configuration indicator is a first value, and placing said sense amplifier in the second operating mode if at least one configuration indicator is a second value;

wherein the first operating mode is a complementary differential operating mode, and the second operating mode is a referenced differential operating mode.

18. An integrated circuit as in claim 17, wherein said at least one control signal selects the complementary differential operating mode of said sense amplifier, and wherein said at least one control signal selects the referenced differential operating mode.

19. A method for operating a memory, the memory having a first array portion and a second array portion, the first array portion and the second array portion being coupled to a plurality of sense amplifiers, the method comprising the steps of:

selecting one of a plurality of memory modes for a first address range of said memory, said plurality of memory modes including a high density memory mode and a high speed/reliability memory mode;

if the high density memory mode is selected for the first address range of said memory, placing a first one of said plurality of sense amplifiers in a first operating mode; and if the high speed/reliability memory mode is selected for the first address range of said memory, placing the first one of said plurality of sense amplifiers in a second operating mode;

wherein the first operating mode is a complementary differential operating mode of said sense amplifier, and wherein the second operating mode is a referenced differential operating mode.

20. A method for operating a memory as in claim 19, further comprising the steps of:

selecting one of the plurality of memory modes for a second address range of said memory, said plurality of memory modes including the high density memory mode and the high speed/reliability memory mode;

if the high density memory mode is selected for the second address range of said memory, placing a second one of said plurality of sense amplifiers in the first operating mode; and if the high speed/reliability memory mode is selected for the second address range of said memory, placing the second one of said plurality of sense amplifiers in the second operating mode.

21. A method for operating a memory as in claim 20, further comprising the steps of:

selecting the first address range by storing at least a first address value in a first register portion; and selecting the second address range by storing at least a second address value in a second register portion;

wherein said step of selecting one of the plurality of memory modes for the first address range of said memory comprises the step of:
programming a third register portion with a first mode configuration value; and wherein said step of selecting one of the plurality of memory modes for a second address range of said memory comprises the step of:
programming a fourth register portion with a second mode configuration value.

22. A method for operating a memory as in claim 19, wherein said high speed/reliability memory mode may alternately be used as a high reliability mode.

* * * * *